United States Patent

Hayashi et al.

[11] Patent Number: 5,841,279
[45] Date of Patent: Nov. 24, 1998

[54] BODY COIL, GRADIENT COIL AND NMR APPARATUS

[75] Inventors: Yujiro Hayashi; Kazuhiko Hayakawa; Kazuhiko Sato; Zenchi Hiyama, all of Tokyo, Japan

[73] Assignee: GE Yokogawa Medical Systems, Limited, Tokyo, Japan

[21] Appl. No.: 771,996

[22] Filed: Dec. 23, 1996

[30] Foreign Application Priority Data

Apr. 5, 1996 [JP] Japan ................................. 8-084125

[51] Int. Cl.$^6$ ......................................................... G01V 3/00
[52] U.S. Cl. ................................................ 324/318; 324/322
[58] Field of Search ................................... 324/318, 322, 324/314, 307, 309; 128/653.5

[56] References Cited

U.S. PATENT DOCUMENTS

| 4,954,781 | 9/1990 | Hirata ......................................... 324/318 |
| 5,256,969 | 10/1993 | Miyajima et al. ........................ 324/318 |
| 5,570,021 | 10/1996 | Dachniwskyj et al. ................. 324/318 |
| 5,630,415 | 5/1997 | Kaufman ................................... 324/318 |

*Primary Examiner*—Louis M. Arana
*Attorney, Agent, or Firm*—Moonray Kojima

[57] ABSTRACT

An RF coil is surrounded externally with dampers. Arresting plates are attached securely to the exterior of the dampers to arrest vibrations of the latter. The thickness of the arresting plates is made substantially the same as that of a body coil bobbin.

10 Claims, 11 Drawing Sheets

Body coil bobbin 11
Damper 13

Gradient coil 60

Wrappings 26
Gradient coil bobbin 21
X-axis coil 24
Y-axis coil 23
Z-axis coil 22

Body coil
10B

BODY COIL, GRADIENT COIL AND NMR APPARATUS

BACKGROUND OF THE INVENTION

1. Field of the Invention

The present invention relates to a body coil, a gradient coil and an NMR (nuclear magnetic resonance) apparatus. More particularly, the invention relates to a body coil, a gradient coil and an NMR apparatus capable of suppressing the emanation of unpleasant noise.

2. Description of the Related Art

In conventional NMR apparatuses, a gradient coil produces mechanical vibrations when fed with pulse-like repetitive large currents to generate gradient magnetic fields. The vibrating coil generates noise which sounds unpleasant to the patient being examined.

SUMMARY OF THE INVENTION

It is therefore an object of the present invention to provide a body coil, a gradient coil and an NMR apparatus simply structured to suppress the generation of such disagreeable noise.

In carrying out the invention and according to a first aspect thereof, there is provided a body coil comprising a body coil bobbin, an RF coil attached externally to the body coil bobbin, dampers for covering the body coil bobbin and the RF coil, and arresting plates attached externally to the dampers to arrest vibrations of the latter.

In a preferred structure of the body coil according to the first aspect of the invention, the thickness of the body coil bobbin is substantially the same as that of the arresting plates.

According to a second aspect of the invention, there is provided a gradient coil comprising a gradient coil bobbin, at least one coil attached externally to the gradient coil bobbin, wrappings for wrapping the gradient coil bobbin and the one or more coils, and dampers furnished interposingly either between the coils and the wrappings or between the coils.

In a preferred structure of the gradient coil according to the second aspect of the invention, the dampers are furnished interposingly between the coils and the wrappings, and the total thickness of the gradient coil bobbin and the coils put together is substantially the same as the thickness of the wrappings.

According to a third aspect of the invention, there is provided a gradient coil comprising a gradient coil bobbin, at least one coil attached externally to the gradient coil bobbin, wrappings for wrapping the gradient coil bobbin and the one or more coils, dampers furnished inside the gradient coil bobbin, and arresting plates attached internally to the dampers to arrest vibrations of the latter.

According to a fourth aspect of the invention, there is provided an NMR apparatus comprising at least either the body coil or the gradient coil defined above.

The inventors have first carried out this invention upon finding that the bobbin and the RF coil of the body coil, when covered with the dampers which in turn are furnished externally with the arresting plates to arrest damper vibrations, combine to provide a better vibration-damping effect than if either the body coil bobbin or the RF coil is used alone for vibration reduction. Equipped with the arresting plates, the body coil of the invention significantly improves its ability to suppress vibrations and thereby to inhibit unpleasant noise.

The inventors have also carried out this invention upon finding that the vibration-damping effect is further improved when the thickness of the arresting plates is substantially the same as that of the body coil bobbin in a preferred structure of the body coil. The better vibration-damping effect translates into a further reduction of disagreeable noise.

The inventors have also carried out this invention upon finding that the dampers interposed between the coils and the wrappings of the gradient coil or between the coils inhibit high-frequency noise which is particularly irritating to the ear. By suppressing the particularly annoying high-frequency noise, the gradient coil of this structure enhances the quality of the sound reaching the ears of the patient being examined.

The inventors have also carried out this invention upon finding that suppression of the high-frequency noise is particularly effective when the dampers are located at the center of the gradient coil. By inhibiting the irritating high-frequency noise, the gradient coil of this structure also improves the quality of the sound reaching the ears of the patient being examined.

The inventors have also carried out this invention upon finding that the dampers installed inside the bobbin of the gradient coil, in combination with the arresting plates placed inside the dampers, provide a better vibration-damping effect than if the dampers or the arresting plates are used alone for vibration reduction. With its enhanced vibration-damping effect, the gradient coil of this structure lowers the level of annoying noise.

The NMR apparatus of the invention incorporating the components having the above-described benefits minimizes the irritating noise specific to conventional apparatuses. In so doing, the inventive NMR apparatus increases to a tolerable level the quality of the sound reaching the ears of the patient being examined.

The body coil of the invention is structured to have the arresting plates arrest the vibration of the dampers. The combined effects of the vibration damping components further reduce annoying noise.

The gradient coil of the invention is capable of suppressing the high-frequency noise which is particularly irritating to the ear. This is an appreciable improvement of the quality of the noise reaching the ears of the patient being examined.

The NMR apparatus of the invention incorporating the above components thus provides at least one of the two advantages: suppressing irritating noise stemming from vibration, and improving to a tolerable level the quality of the mechanical sound reaching the ears of the patient being examined.

Farther objects and advantages of the present invention will be apparent from the following description of the preferred embodiments of the invention as illustrated in the accompanying drawings.

DESCRIPTION OF THE PREFERRED EMBODIMENTS

First Embodiment

Figure 1:
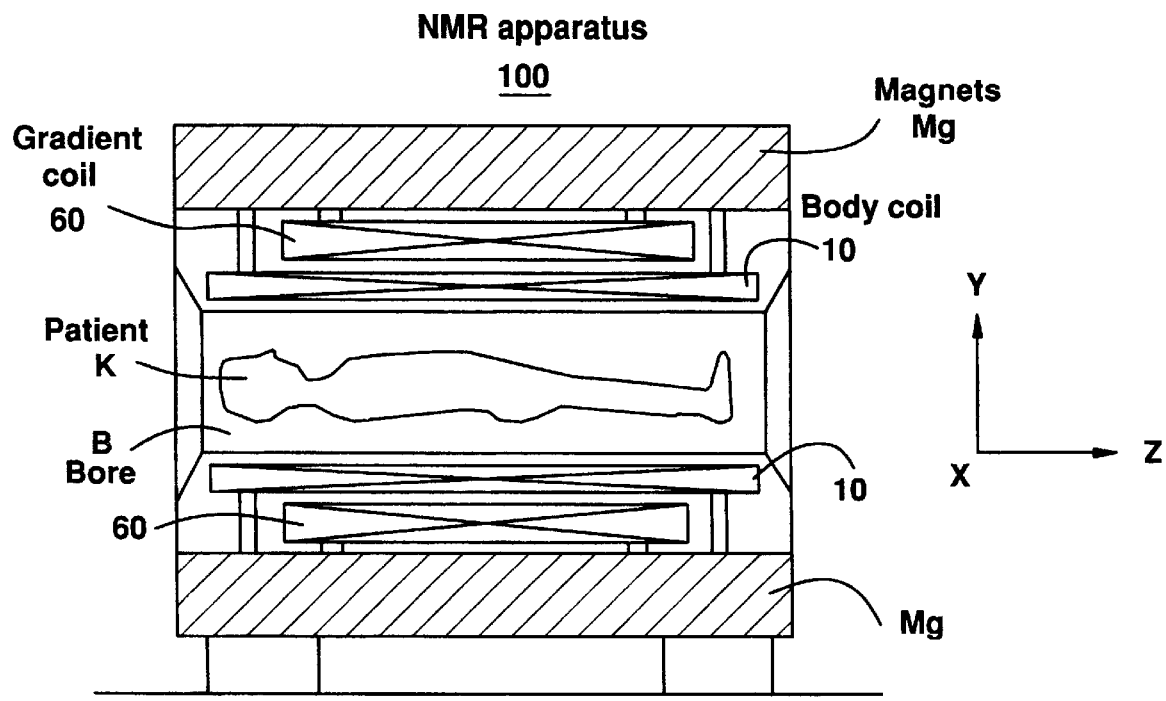
FIG. 1 is a cross-sectional view of an NMR apparatus practiced as a first embodiment of the invention.

FIG. 1 is a cross-sectional view of an NMR apparatus 100 practiced as the first embodiment of the invention. The NMR apparatus 100 comprises a body coil 10 and a gradient coil 60 surrounding a bore B constituting a cylindrical space in which to accommodate a patient K. The body coil 10 and gradient coil 60 are externally surrounded by magnets Mg.

The magnets Mg generate a main magnetic field while the gradient coil 60 produces gradient magnetic fields. RF pulses transmitted from the body coil 10 excite target nuclides in the patient K's body, and the body coil 10 receives NMR signals from the patient K in return.

Figure 2:
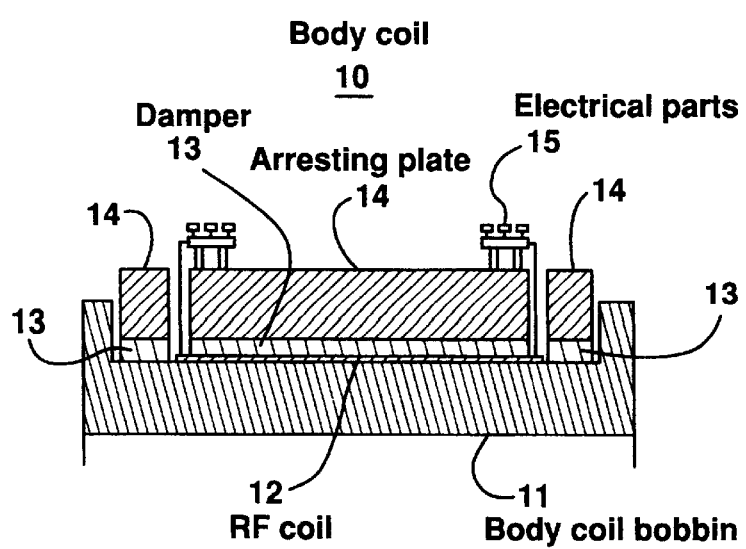
FIG. 2 is a cross-sectional view of a body coil used in the first embodiment.

FIG. 2 is a cross-sectional view of the body coil 10. The body coil 10 comprises a body coil bobbin 11 made of FRP, an RF coil 12 of a copper pattern attached externally to the bobbin 11, dampers 13 made of vinyl chloride-vinyl acetate copolymer rubber covering the body coil bobbin 11 and RF coil 12, arresting plates 14 attached securely to the exterior of the dampers 13, and electrical parts 15.

Figure 3:
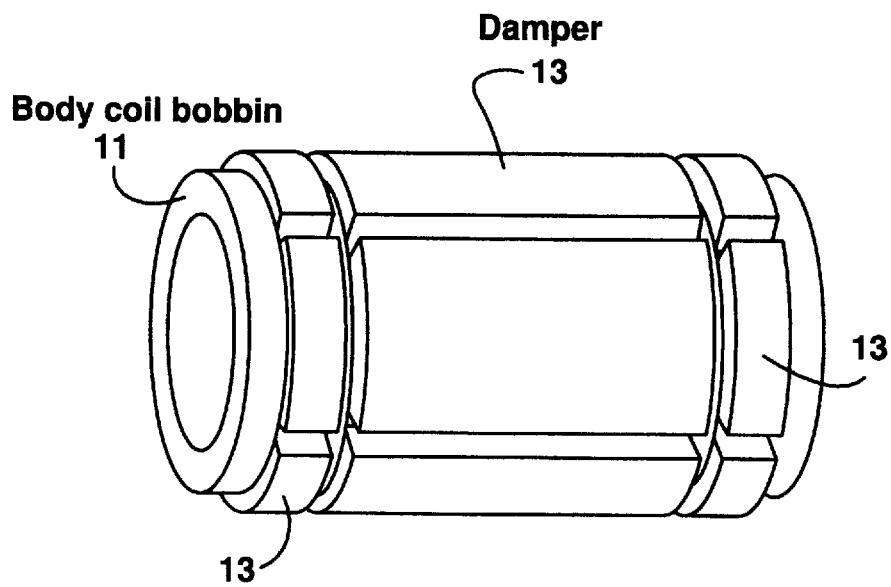
FIG. 3 is a schematic view showing how dampers are attached to the body coil in FIG. 1.

Illustratively, the body coil bobbin 11 is 4 mm thick, the RF coil 12 is 0.1 mm thick, the dampers 13 are 1 mm thick each, and the arresting plates 14 are 4 mm thick each. As shown in FIG. 3, the dampers 13 are divided into portions of appropriate sizes when attached to the bobbin and RF coil.

Figure 4:
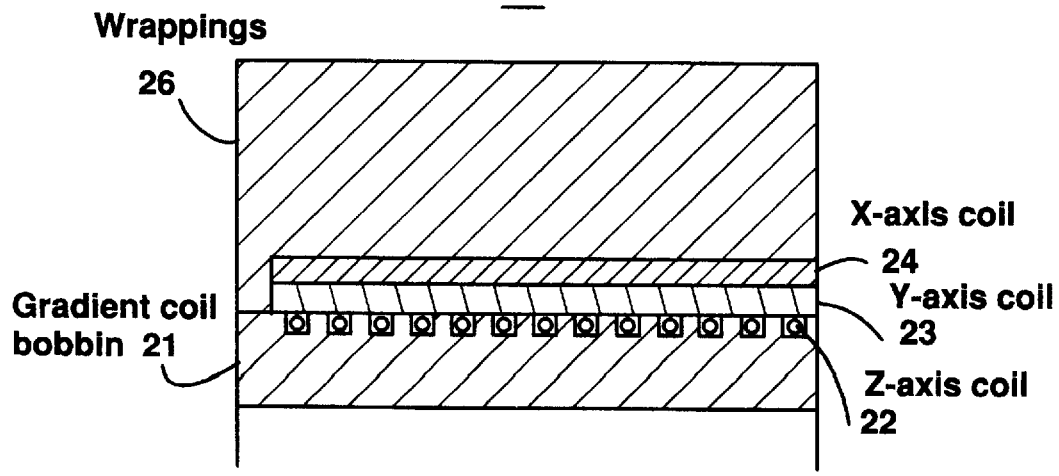
FIG. 4 is a cross-sectional view of a gradient coil used in the first embodiment.

FIG. 4 is a cross-sectional view of the gradient coil 60. The gradient coil includes a gradient coil bobbin 21 made of FRP; a Z-axis coil 22, a Y-axis coil 23 and an X-axis coil 24 of copper patterns attached externally to the gradient coil bobbin 21; and wrappings 26 made of FRP wrapping the gradient coil bobbin 21 and coil 24.

Illustratively, the gradient coil bobbin 21 is 8 mm thick, the Y-axis coil 23 is 4 mm thick, the Z-axis coil 22 is 4 mm thick, and the wrappings 26 made of FRP are 16 mm thick. The thickness of the X-axis coil 24 is included in that of the gradient coil bobbin 21.

The Z-axis coil 22 generates a gradient magnetic field in the Z-axis direction (see FIG. 1), the Y-axis coil 23 produces a gradient magnetic field in the Y-axis direction (FIG. 1), and the X-axis coil 24 creates a gradient magnetic field in the X-axis direction (FIG. 1).

Figure 5:
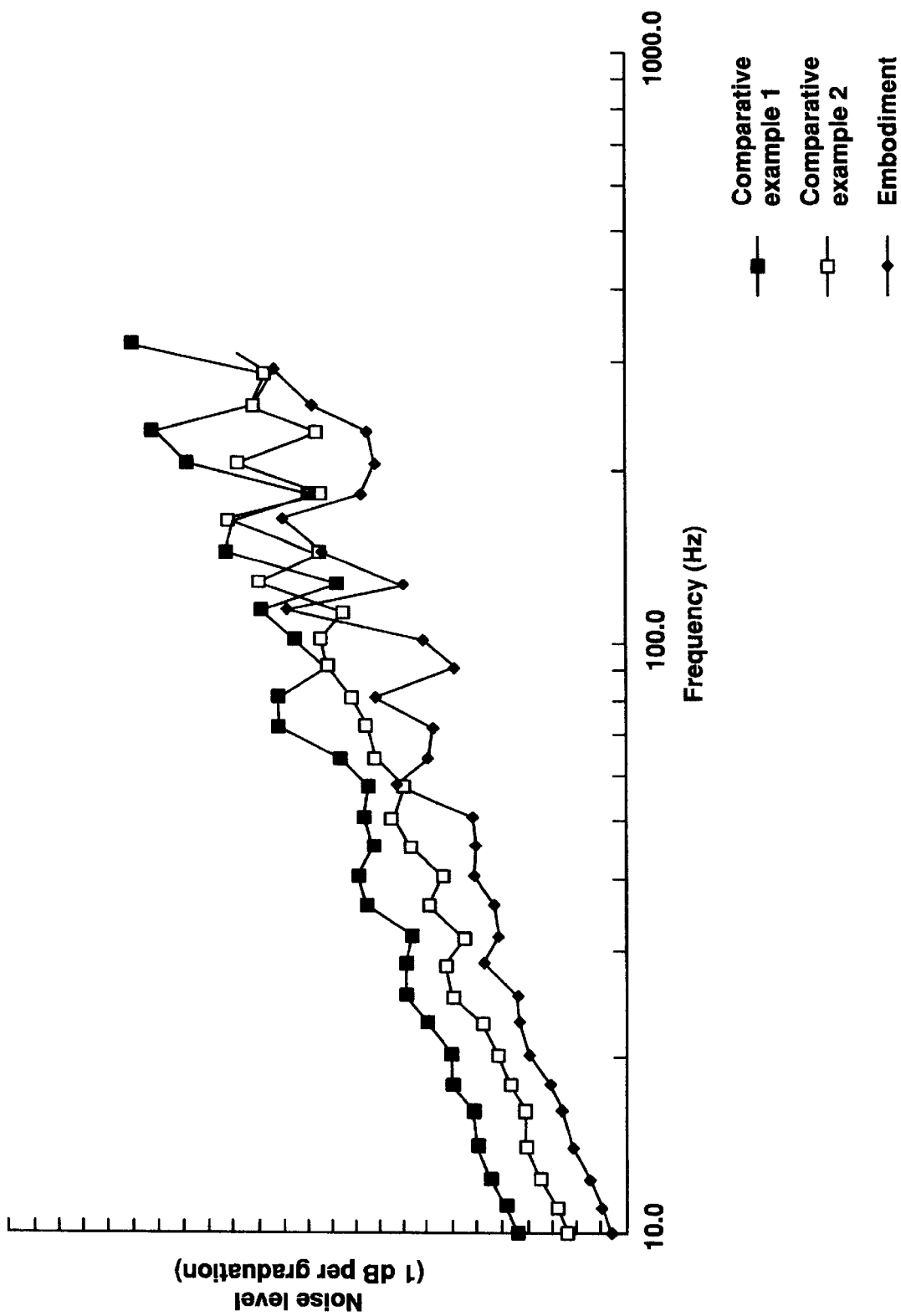
FIG. 5 is a graphic representation comparing noise levels of body coils in FIGS. 1, 6 and 7.
Figure 6:
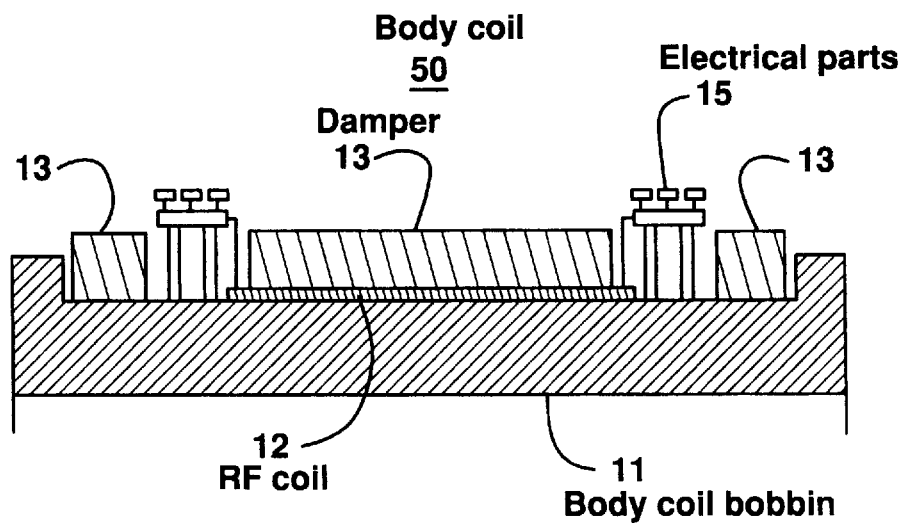
FIG. 6 is a cross-sectional view of a body coil used as a comparative example 1.
Figure 7:
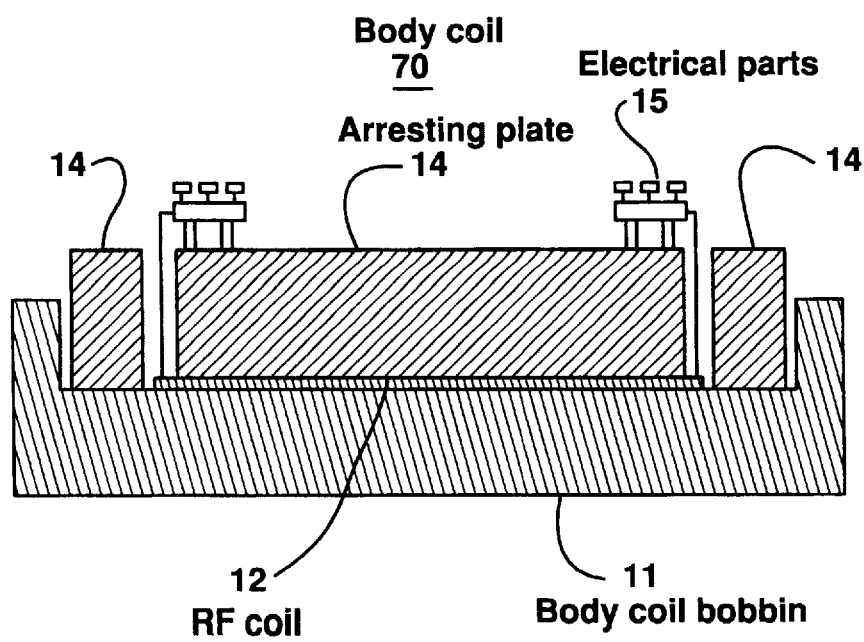
FIG. 7 is a cross-sectional view of a body coil used as a comparative example 2.

FIG. 5 is a graphic representation comparing noise level characteristics of the body coil 10, a body coil 50 used as a comparative example 1 (see FIG. 6), and a body coil 70 used as a comparative example 2 (see FIG. 7). Noise levels herein refer to the relative values of measurements taken on a noise level meter placed inside the bore B when the gradient coil 60 is driven with trapezoidal pulses of frequencies indicated on the axis of abscissa of the graph.

As shown in FIG. 6, the body coil 50 of the comparative example 1 is devoid of arresting plates 14 and has its dampers 13 made to a thickness of 3 mm. The body coil 70 of the comparative example 2, as indicated in FIG. 7, is devoid of dampers 13 and has its arresting plates 14 prepared to a thickness of 5 mm.

As evident in FIG. 5, the body coil 10 (combining its dampers 13 being 1 mm thick, with its arresting plates 14 being 4 mm in thickness) offers a better vibration-damping effect than either the dampers 13 (3 mm thick for the body coil 50 of the comparative example 1) or the arresting plates 14 (5 mm thick for the body coil 70 of the comparative example 2) used alone.

Simply structured as described, the NMR apparatus 100 and the body coil 10 employed therein combine to inhibit irritating noise from reaching the ears of the patient K without increasing the weight of the body coil. In experiments conducted by the inventors, a noise reduction of about 6 dB was observed at a frequency of 100 Hz.

It should be noted that the dampers 13 and arresting plates 14 are attached externally to the RF coil 12. This means that when the noise reduction capability is enhanced by making the apparatus bulkier as a whole, the sensitivity of the body coil still remains unchanged and the bore B for accommodating the patient K still has as much space as before.

Second Embodiment

Figure 8:
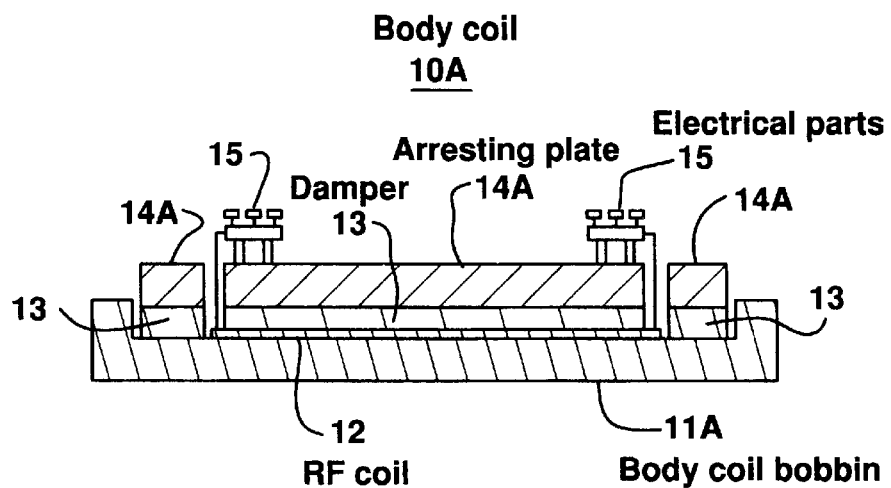
FIG. 8 is a cross-sectional view of a body coil practiced as a second embodiment of the invention.

FIG. 8 is a cross-sectional view of a body coil 10A practiced as the second embodiment of the invention. The body coil 10A comprises a body coil bobbin 11A made of FRP, an RF coil 12 of a copper pattern attached externally to the body coil bobbin 11A, dampers 13 made of vinyl chloride-vinyl acetate copolymer rubber covering the body coil bobbin 11A and RF coil 12, arresting plates 14A made of FRP attached securely to the exterior of the dampers 13, and electrical parts 15.

Illustratively, the body coil bobbin 11A is 2 mm thick, the RF coil 12 is 0.1 mm thick, the dampers 13 are 1 mm thick each, and the arresting plates 14A are 2 mm thick each.

Figure 9:
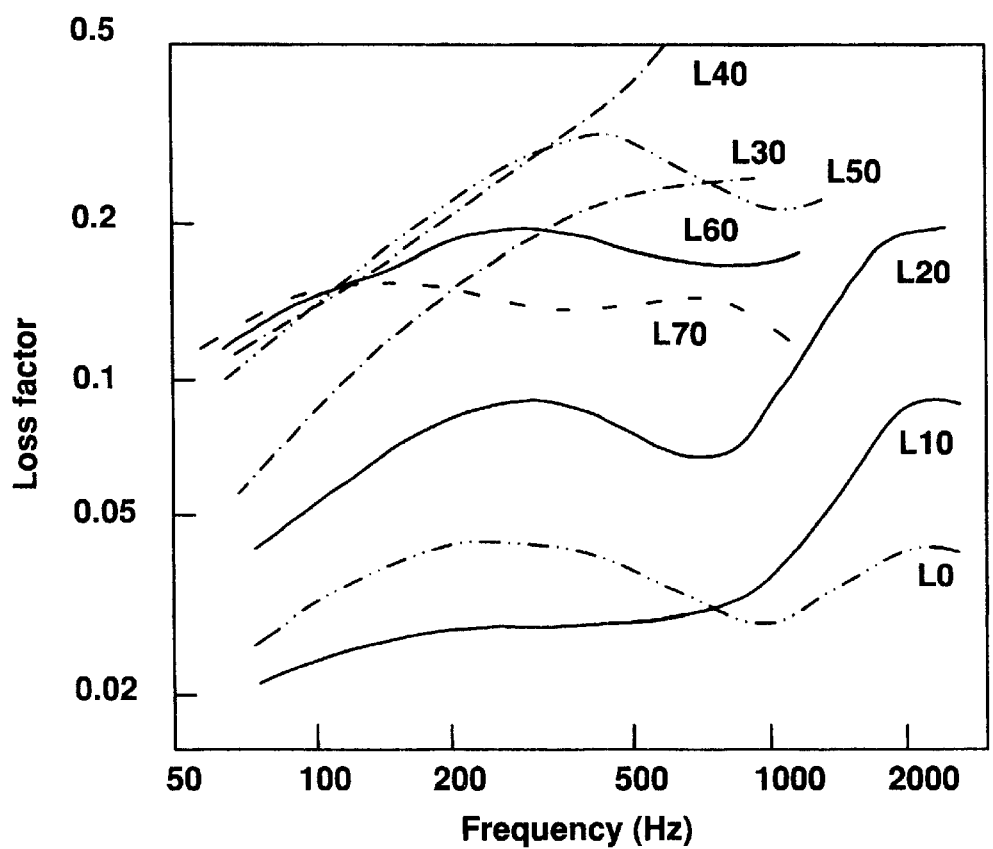
FIG. 9 is a graphic representation showing frequency characteristics of loss factors associated with a layered structure of the body coil in FIG. 8.

FIG. 9 is a graphic representation showing frequency characteristics of loss factors associated with a layered structure of the body coil 10A.

The loss factors herein refer to the values calculated from two kinds of vibrations: mechanical vibrations at frequencies shown on the axis of abscissa, applied to one plane of the layered structure of the body coil 10A; and vibration readings taken on a vibration meter placed on the other plane of the layered structure.

In FIG. 9, a curve L0 stands for the characteristic at an ambient temperature of 0° C., L10 for the characteristic at 10° C., L20 for the characteristic at 20° C., L30 for the characteristic at 30° C., L40 for the characteristic at 40° C., L50 for the characteristic at 50° C., L60 for the characteristic at 60° C., and L70 for the characteristic at 70° C. The curves are drawn differently in type so that they can be distinguished from one another clearly where they overlap.

Over the temperature range of 30° C. through 60° C. at which the body coil is used, the loss factors are shown to be about 0.1 or more, proving good results. Such temperature dependency stems mainly from the properties of the dampers 13.

Figure 10:
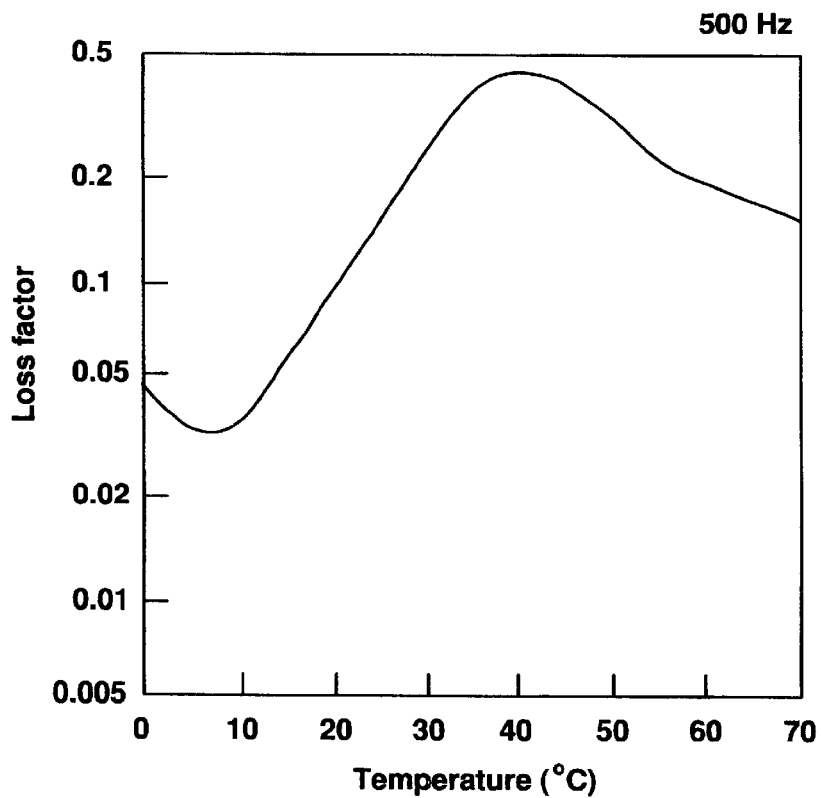
FIG. 10 is a graphic representation indicating temperature characteristics of the loss factors associated with the layered structure of the body coil in FIG. 8.

FIG. 10 is a graphic representation indicating temperature characteristics of the loss factors associated with the layered structure of the body coil 10A at 500 Hz. Over the temperature range of 30° C. through 60° C. at which the body coil 10A is used, the loss factors are shown to be about 0.2 or more, also proving good results.

Third Embodiment

Figure 11:
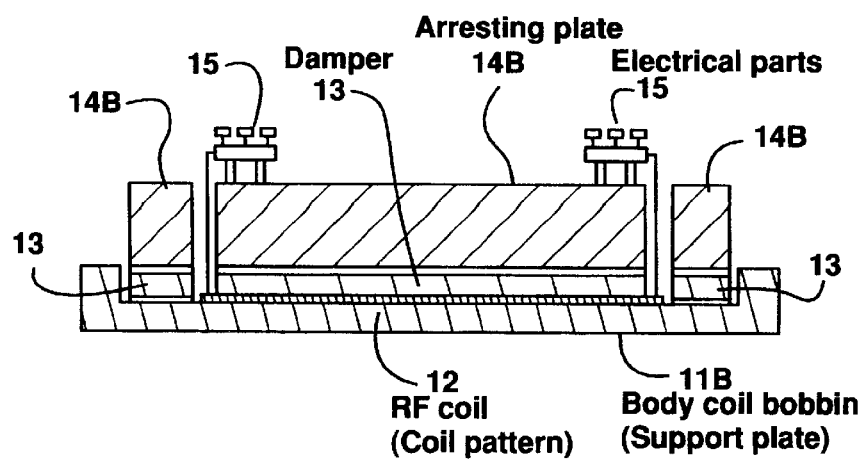
FIG. 11 is a cross-sectional view of a body coil practiced as a third embodiment of the invention.

FIG. 11 is a cross-sectional view of a body coil 10B practiced as the third embodiment of the invention. The body coil 10B comprises a body coil bobbin 11B made of FRP, an RF coil 12 of a copper pattern attached externally to the body coil bobbin 11B, dampers 13 made of vinyl chloride-vinyl acetate copolymer rubber covering the body coil bobbin 11B and RF coil 12, arresting plates 14B made of FRP attached securely to the exterior of the dampers 13, and electrical parts 15.

Illustratively, the body coil bobbin 11B is 1 mm thick, the RF coil 12 is 0.1 mm thick, the dampers 13 are 1 mm thick each, and the arresting plates 14B are 4 mm thick each.

Figure 12:
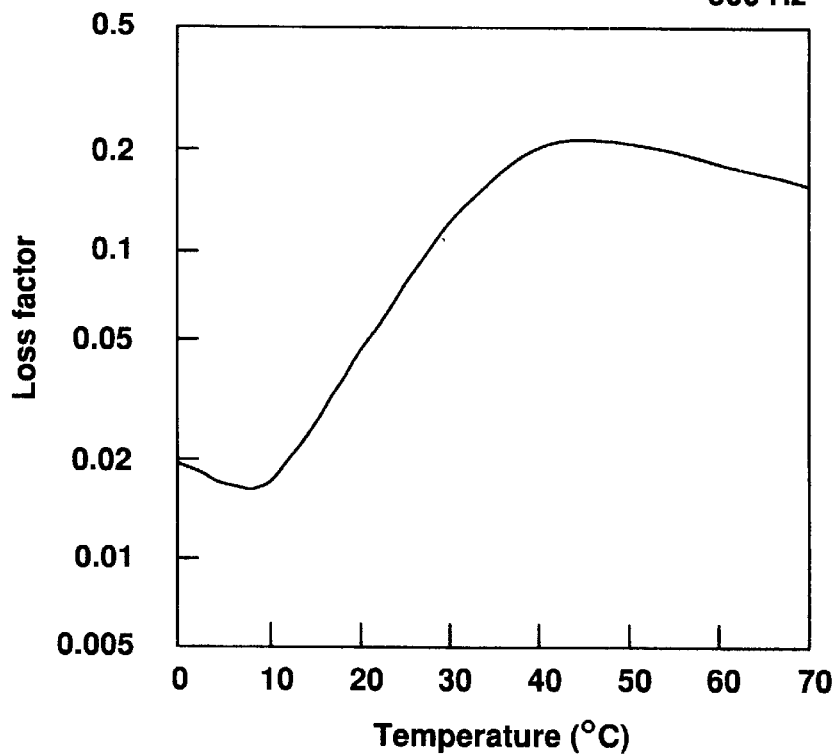
FIG. 12 is a graphic representation illustrating temperature characteristics of loss factors associated with a layered structure of the body coil in FIG. 11.

FIG. 12 is a graphic representation illustrating temperature characteristics of loss factors associated with a layered structure of the body coil 10B at 500 Hz. Over the temperature range of 30° C. through 60° C. at which the body coil 10B is used, the loss factors are shown to be about 0.1 or more, proving good results.

Comparing FIGS. 10 and 12 indicates that the body coil characteristics shown in FIG. 10 are better than those in FIG. 12. This means that the damping of vibrations is particularly effectively when, as in the case of the body coil 10A, the arresting plates 14A are substantially the same in thickness as the body coil bobbin 11A.

Fourth Embodiment

Figure 13:
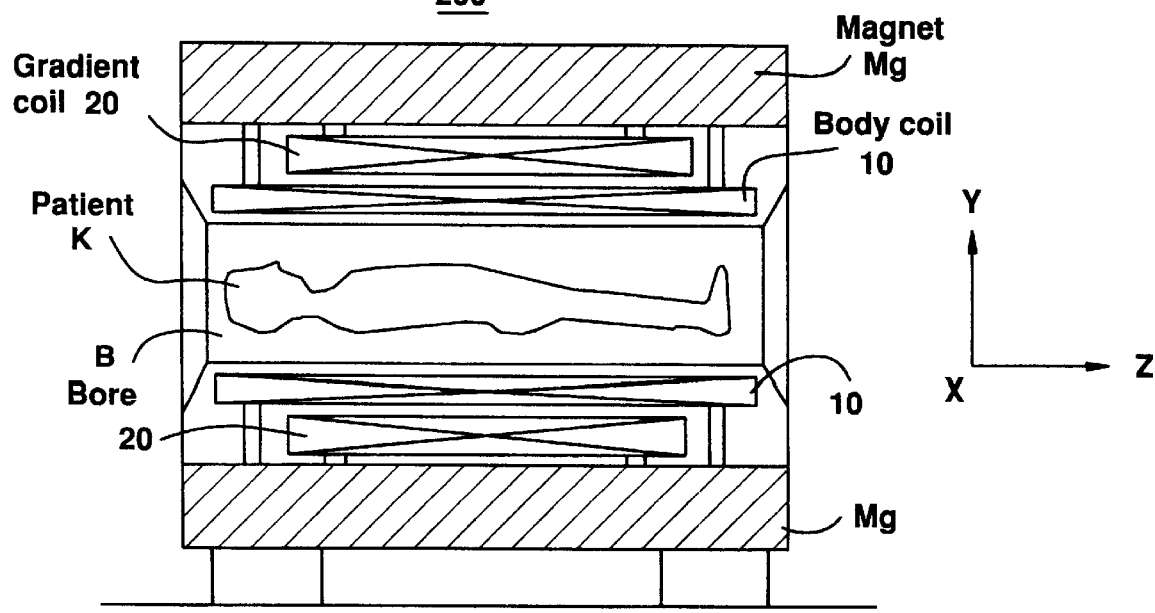
FIG. 13 is a cross-sectional view of an NMR apparatus practiced as a fourth embodiment of the invention.

FIG. 13 is a cross-sectional view of an NMR apparatus 200 practiced as the fourth embodiment of the invention. The NMR apparatus 200 comprises a body coil 10 and a gradient coil 20 surrounding a bore B constituting a cylindrical space in which to accommodate the patient K. The body coil 10 and gradient coil 20 are in turn surrounded externally by magnets Mg.

The magnets Mg generate a main magnetic field while the gradient coil 60 produces gradient magnetic fields. RF pulses transmitted from the body coil 10 excite target nuclides in the patient K's body, and the body coil 10 receives NMR signals from the patient K in return.

Figure 14:
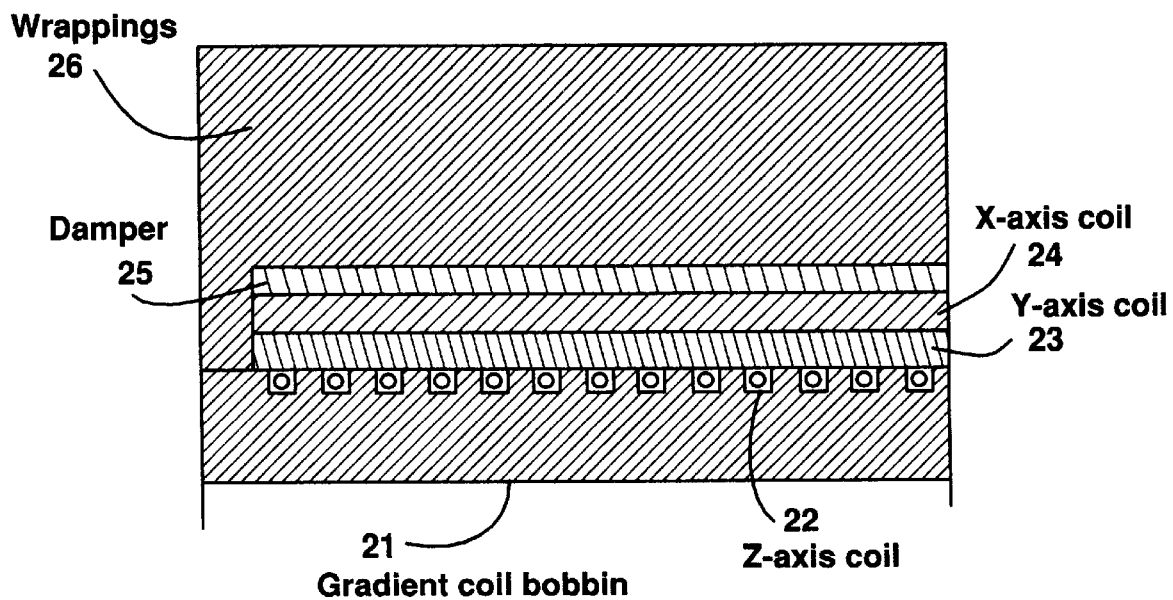
FIG. 14 is a cross-sectional view of a gradient coil used in the fourth embodiment.

FIG. 14 is a cross-sectional view of the gradient coil 20. The gradient coil 20 comprises a gradient coil bobbin 21 made of FRP; a Z-axis coil 22, a Y-axis coil 23 and an X-axis coil 24 of copper patterns attached externally to the gradient coil bobbin 21; dampers 25 made of vinyl chloride-vinyl acetate copolymer rubber attached securely to the exterior of the X-axis coil 24; and wrappings 26 made of FRP furnished securely to wrap the gradient coil bobbin 21 and the dampers 25.

Illustratively, the gradient coil bobbin 21 is 8 mm thick, the Y-axis coil 23 is 4 mm thick, the Z-axis coil 22 is 4 mm thick, the dampers 25 are 5 mm thick each, and the wrappings 26 made of FRP are 14 mm thick.

Figure 15:
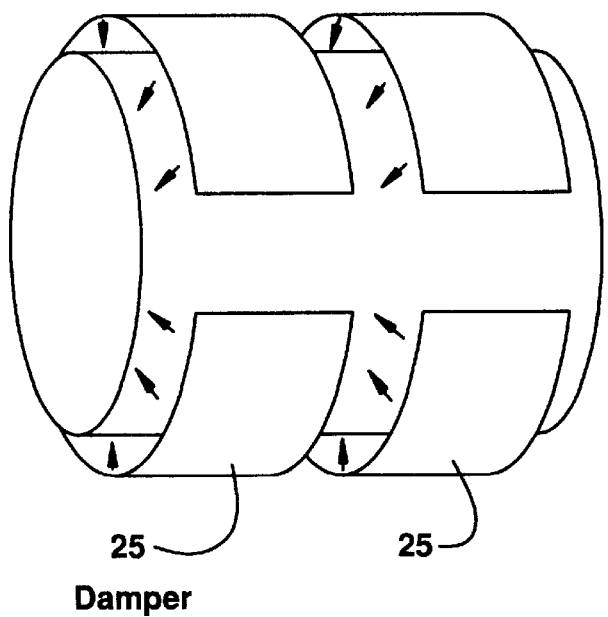
FIG. 15 is a schematic view sketching one way of attaching dampers to the gradient coil in FIG. 14.

FIG. 15 is a schematic view sketching one way of attaching the dampers 25 to the gradient coil 20. The dampers 25 are preferably divided into portions of appropriate sizes when attached to the gradient coil in order to minimize inclusion of air bubbles in the bonded gaps. Alternatively, several through holes may be provided in the dampers 25 to help bleed trapped air bubbles.

Figure 16:
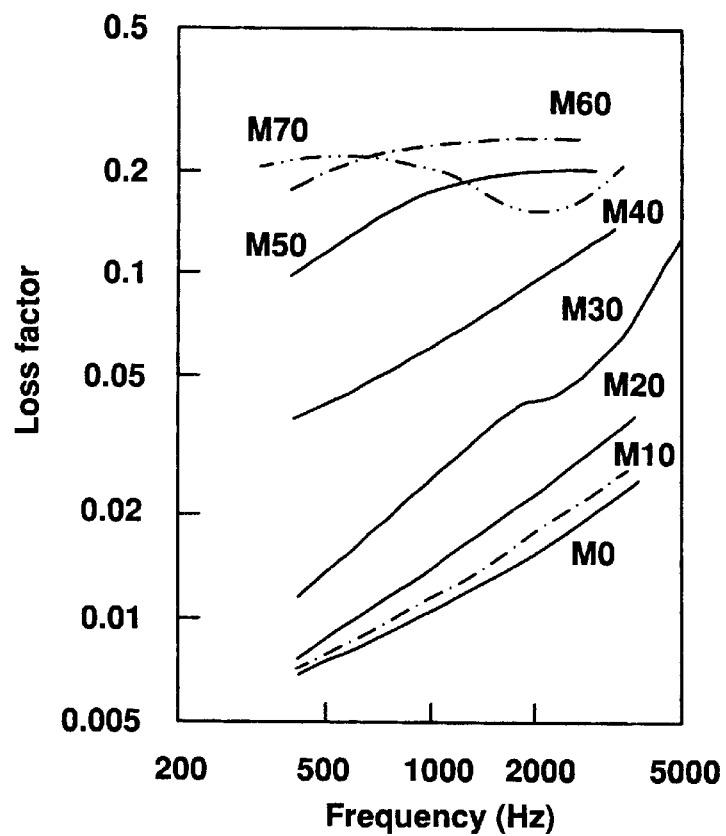
FIG. 16 is a graphic representation showing frequency characteristics of loss factors associated with a layered structure of the gradient coil in FIG. 14.

FIG. 16 is a graphic representation showing frequency characteristics of loss factors associated with a layered structure of the gradient coil 20. The loss factors herein refer to the values calculated from two kinds of vibrations: mechanical vibrations at frequencies shown on the axis of abscissa, applied to one plane of the layered structure of the gradient coil 20; and vibration readings taken on a vibration meter placed on the other plane of the layered structure.

In FIG. 16, a curve MO stands for the characteristic at an ambient temperature of 0° C., M10 for the characteristic at 10° C., M20 for the characteristic at 20° C., M30 for the characteristic at 30° C., M40 for the characteristic at 40° C., M50 for the characteristic at 50° C., M60 for the characteristic at 60° C., and M70 for the characteristic at 70° C.

Over the temperature range of 40° C. through 70° C. at which the gradient coil 20 is used, the loss factors are shown to be about 0.1 or more at high-frequency vibrations of 2,000 Hz or higher, proving good results.

Thus the NMR apparatus 200 and the gradient coil 20 therein combine to suppress high-frequency noise which is particularly irritating to the ear. This improves to a tolerable level the quality of the mechanical noise reaching the ears of the patient K under examination.

Figure 17:
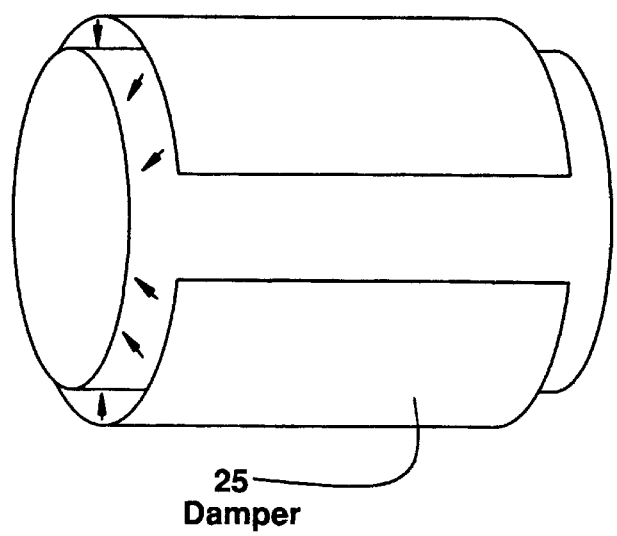
FIG. 17 is a schematic view portraying another way of attaching dampers to the gradient coil in FIG. 14.

FIG. 17 is a schematic view portraying another way of attaching the dampers 25 to the gradient coil 20. Pasting the dampers undivided onto the entire surface of the coil provides a good vibration-damping effect.

Fifth Embodiment

Figure 18:
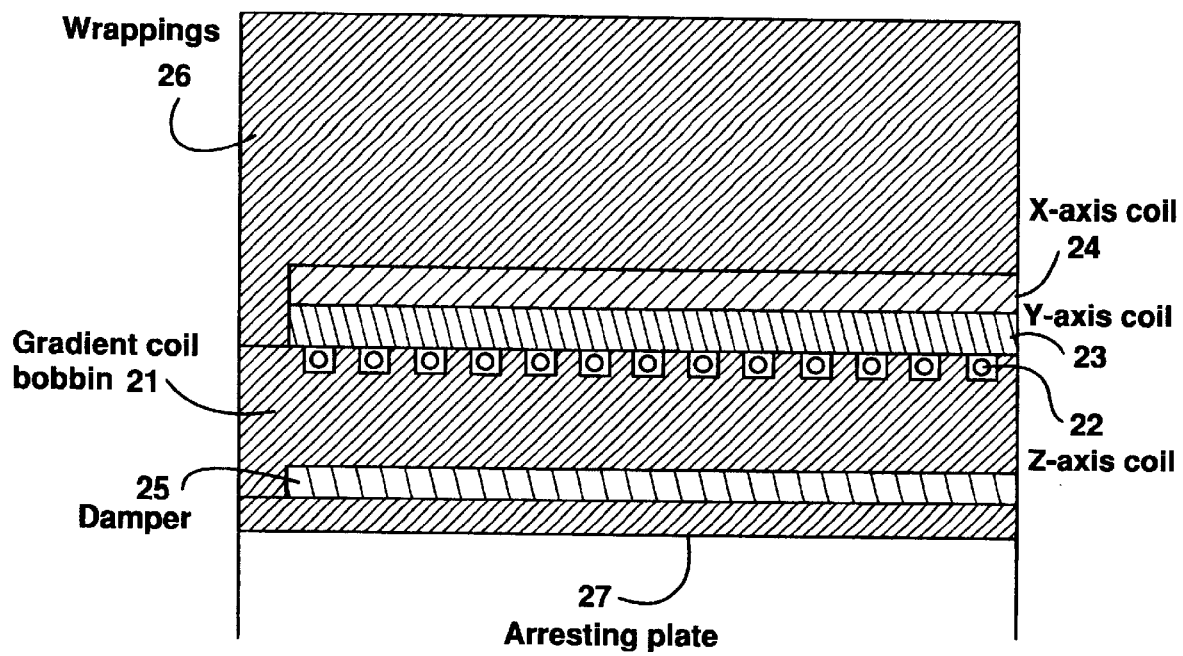
FIG. 18 is a cross-sectional view of a gradient coil practiced as a fifth embodiment of the invention.

FIG. 18 is a cross-sectional view of a gradient coil practiced as the fifth embodiment of the invention. The gradient coil 20A comprises a gradient coil bobbin 21 made of FRP; a Z-axis coil 22, a Y-axis coil 23 and an X-axis coil 24 of copper patterns attached externally to the gradient coil bobbin 21; wrappings 26 made of FRP wrapping the gradient coil bobbin 21 and the X-axis coil 24; dampers 25 attached securely to the interior of the gradient coil bobbin 21; and arresting plates 27 furnished securely to cover the gradient coil bobbin 21 and the dampers 25.

Illustratively, the arresting plates 27 are 2 mm thick each, the dampers 25 are 2 mm thick each, the gradient coil bobbin 21 is 8 mm thick, the Y-axis coil 23 is 4 mm thick, the Z-axis coil 22 is 4 mm thick, and the wrappings 26 made of FRP are 16 mm thick.

Figure 19:
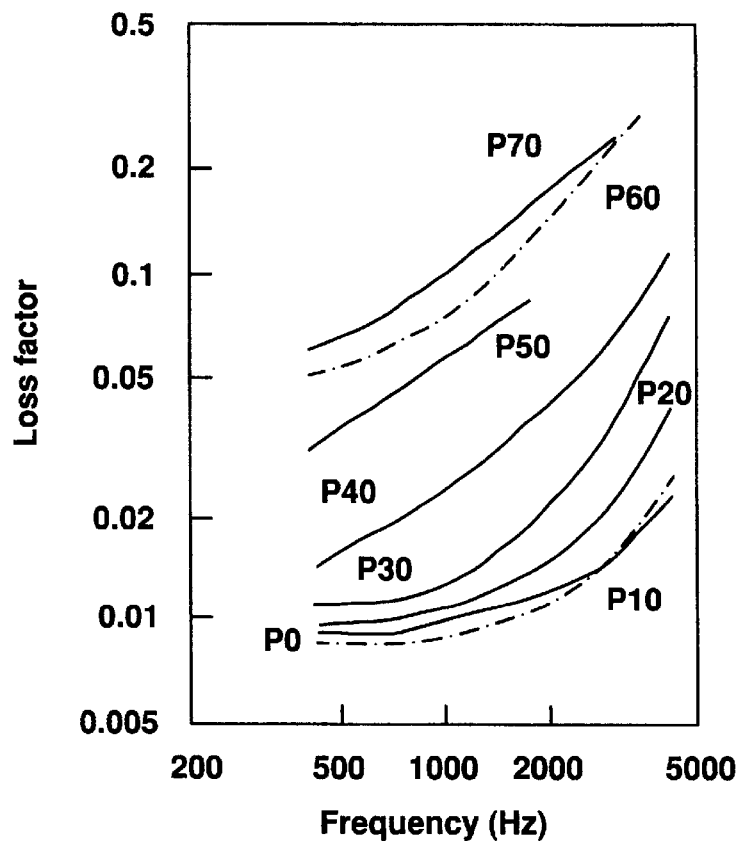
FIG. 19 is a graphic representation showing frequency characteristics of loss factors associated with a layered structure of the gradient coil in FIG. 18.

FIG. 19 is a graphic representation showing frequency characteristics of loss factors associated with a layered structure of the gradient coil 20A. The loss factors herein refer to the values calculated from two kinds of vibrations: mechanical vibrations at frequencies shown on the axis of abscissa, applied to one plane of the layered structure of the gradient coil 20A; and vibration readings taken on a vibration meter placed on the other plane of the layered structure.

In FIG. 19, a curve PO stands for the characteristic at an ambient temperature of 0° C., P10 for the characteristic at 10° C., P20 for the characteristic at 20° C., P30 for the characteristic at 30° C., P40 for the characteristic at 40° C., P50 for the characteristic at 50° C., P60 for the characteristic at 60° C., and P70 for the characteristic at 70° C.

Over the temperature range of 40° C. through 70° C. at which the gradient coil 20A is used, the loss factors are shown to be about 0.1 or more at high-frequency vibrations of 4,000 Hz or higher, proving good results.

Thus the gradient coil 20A suppresses high-frequency noise which is particularly irritating to the ear. This improves to a tolerable level the quality of the mechanical noise reaching the ears of the patient K being examined.

Comparing FIGS. 16 and 19 indicates that the gradient coil characteristics shown in FIG. 16 are better than those in FIG. 19. This means that the damping of high-frequency vibrations is particularly effectively when, as in the case of the gradient coil 20, the dampers 25 are interposed between the X-axis coil 24 and the wrappings 26 made of FRP and the total thickness of the bobbin 21 and coils 23 and 24 is made substantially the same as the thickness of the wrappings 26 made of FRP.

Figure 20:
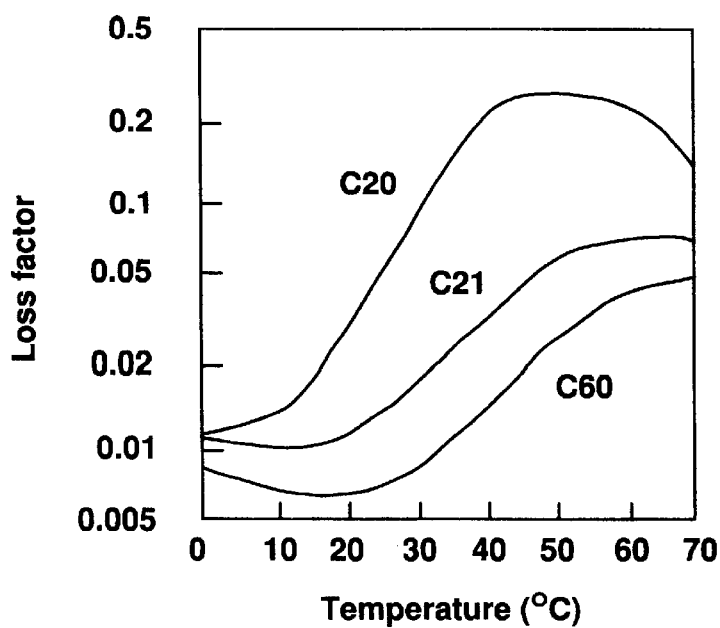
FIG. 20 is a graphic representation indicating temperature characteristics of the loss factors associated with layered structures of the gradient coils in FIGS. 14, 18 and 4.

FIG. 20 is a graphic representation indicating temperature characteristics of the loss factors associated with layered structures of the gradient coil 20 (see FIG. 14), the gradient coil 20A (FIG. 18) and the gradient coil 60 in the first embodiment (FIG. 4) at 500 Hz. In FIG. 20, a curve C20 stands for the characteristic of the gradient coil 20, C20A for the characteristic of the gradient coil 20A, and C60 for the characteristic of the gradient coil 60.

Many widely different embodiments of the invention may be constructed without departing from the spirit and scope of the present invention. It should be understood that the present invention is not limited to the specific embodiments described in the specification, except as defined in the appended claims.

What is claimed is:

1. An NMR apparatus for generating and receiving NMR signals comprising:
   magnetic means for generating a static magnetic field in a measurement space where a body to be examined is to be placed;
   gradient coil means for producing gradient magnetic fields, said gradient coil means being arranged inside said magnetic means; and
   body coil means for exciting target nuclides in said body, said body coil means being arranged inside said gradient coil means with a space and including
   a body coil bobbin,
   an RF coil attached externally to said body coil bobbin,
   dampers for covering said body coil bobbin and said RF coil, and
   arresting plates attached externally to said dampers to arrest vibrations of said dampers.

2. An NMR apparatus for generating and receiving NMR signals comprising:
   magnetic means for generating a static magnetic field in a measurement space where a body to be examined is to be placed;
   gradient coil means for producing gradient magnetic fields, said gradient coil means being arranged inside said magnetic means; and
   body coil means for exciting target nuclides in said body, said body coil means being arranged inside said gradient coil means with a space; wherein said gradient coil means includes
   a gradient coil bobbin,
   at least one coil attached externally to said gradient coil bobbin,
   wrappings for wrapping said gradient coil bobbin and said at least one coil, and
   dampers disposed between said at least one coil and said wrappings.

3. An NMR apparatus for generating and receiving NMR signals comprising:
   magnetic means for generating a static magnetic field in a measurement space where a body to be examined is to be placed;
   gradient coil means for producing gradient magnetic fields, said gradient coil means being arranged inside said magnetic means; and
   body coil means for exciting target nuclides in said body, said body coil means being arranged inside said gradient coil means with a space;
   wherein said gradient coil means comprises:
   a gradient coil bobbin,
   coils attached externally to said gradient coil bobbin,
   wrappings for wrapping said gradient coil bobbin and said coils, and
   dampers interposed between said coils.

4. An NMR apparatus for generating and receiving NMR signals comprising:
   magnetic means for generating a static magnetic field in a measurement space where a body to be examined is to be placed;
   gradient coil means for producing gradient magnetic fields, said gradient coil means being arranged inside said magnetic means; and
   body coil means for exciting target nuclides in said body, said body coil means being arranged inside said gradient coil means with a space;
   wherein said gradient coil means comprises:
   a gradient coil bobbin,
   at least one coil attached externally to said gradient coil bobbin,
   wrappings for wrapping said gradient coil bobbin and said at least one coil,
   dampers disposed inside said gradient coil bobbin, and
   arresting plate attached externally to said dampers to arrest vibrations of said dampers.

5. A body structure for an NMR apparatus comprising:
   a body coil bobbin comprising gradient coils;
   at least one coil disposed externally about said body coil bobbin;
   damper means covering at least said body coil bobbin; and
   arresting means disposed externally about and attached to said damper means for arresting vibrations of said damper means; wherein said body coil bobbin has a radial thickness which is substantially the same as the radial thickness of said arresting means.

6. The structure of claim 5, wherein said at least one coil comprises an RF coil, and wherein said damping means are disposed externally about both said RF coil and said body coil bobbin.

7. The structure of claim 5, wherein said damper means are disposed between said at least one coil and said body coil bobbin.

8. The structure of claim 5, wherein said arresting means comprises a plate.

9. The structure of claim 5, wherein said arresting means comprises a wrapping disposed around both said body coil bobbin and said at least one coil.

10. A body structure of an NMR apparatus comprising:

a gradient coil bobbin;

at least one coil disposed externally about said gradient coil bobbin;

damper means disposed inside said gradient coil bobbin;

wrapping means disposed around both said gradient coil bobbin and said at least one coil; and arresting plate means disposed inside of said damper means to arrest vibrations of said damper means;

wherein said wrapping means has the same radial thickness as the radial thickness of said gradient coil bobbin and said at least one coil.

* * * * *